United States Patent [19]

Schwuttke et al.

[11] Patent Number: 4,494,300
[45] Date of Patent: Jan. 22, 1985

[54] PROCESS FOR FORMING TRANSISTORS USING SILICON RIBBONS AS SUBSTRATES

[75] Inventors: Guenter H. Schwuttke; Kuei H. Yang, both of Poughkeepsie, N.Y.

[73] Assignee: International Business Machines, Inc., Hopewell Junction, N.Y.

[21] Appl. No.: 280,148

[22] Filed: Jun. 30, 1981

[51] Int. Cl.$^3$ .................. H01G 7/00; H01L 11/14
[52] U.S. Cl. .................. 29/571; 29/576 G; 29/576 T; 29/580; 148/1.5; 148/174; 148/175; 156/612; 156/DIG. 73; 156/DIG. 80; 156/DIG. 88; 427/53.1; 427/86; 357/23; 357/59
[58] Field of Search ............ 148/174, 175, 1.5; 29/571, 580, 576 G, 576 T; 156/612, DIG. 73, DIG. 80, DIG. 88; 427/86, 53.1; 357/23, 59; 219/121 L

[56] References Cited

U.S. PATENT DOCUMENTS

| 3,514,676 | 5/1970 | Fa | 357/59 X |
| 3,574,007 | 4/1971 | Hugle | 29/571 X |
| 3,585,088 | 6/1971 | Schwuttke et al. | 148/1.5 X |
| 4,059,461 | 11/1977 | Fan et al. | 427/53.1 X |
| 4,075,055 | 2/1978 | Ciszek et al. | 156/608 |
| 4,116,641 | 9/1978 | Ciszek | 156/608 X |
| 4,198,246 | 4/1980 | Wu | 148/1.5 |
| 4,272,880 | 6/1981 | Pashley | 148/1.5 X |

OTHER PUBLICATIONS

Lee et al., "Thin Film Mosfet's . . . Polycrystalline Silicon", Appl. Phys. Letters, vol. 35 (2), Jul. 15, 1979, pp. 173-175.
Posa, J. G., "All-Silicon Devices Will Match SOS in Performance", Electronics Review, Nov. 22, 1979, pp. 39-40.
Kressel et al., "Epitaxial Silicon p-m Junctions . . . Ribbon", Appl. Phys. Lett., vol. 25, No. 4, Aug. 15, 1974, pp. 197-199.
Kamins et al., "Monolithic Integrated . . . Laser-Annealed Polysilicon", IEEE Trans. on Electron Devices, vol. Ed.-27, No. 1, Jan. 1980, pp. 290-293.

Primary Examiner—William G. Saba
Attorney, Agent, or Firm—John F. Ohlandt; Wolmar Stoffel

[57] ABSTRACT

A process improvement for enabling the development of low cost transistor devices, particularly MOS FETs, in annealed polysilicon formed on an insulator; the improvement resulting from the use of silicon ribbons as substrates.

5 Claims, 3 Drawing Figures

PROCESS FOR FORMING TRANSISTORS USING SILICON RIBBONS AS SUBSTRATES

BACKGROUND OF THE INVENTION

1. Field of the Invention

This invention relates to semiconductor integrated circuit processes and the devices formed thereby. In particular, it relates to the capability of forming active devices e.g. transistors, in a suitable layer constituted of annealed polysilicon that has been formed on a silicon dioxide insulator.

2. Background Information

Although the development of integrated circuitry has proceeded chiefly on the basis of the availability of monocrystalline substrates, particularly of silicon, it has been recognized that a limitation exists with conventional techniques; namely, that only two-dimensional integrated circuits can be formed in such substrates or, as is mostly usually done, in epitaxial layers grown on such substrates.

Great interest has focused on polysilicon as providing an answer to the aforenoted limitation. Thus, because polysilicon supports further growth of silicon dioxide thereon, if the polysilicon can be suitably treated, such as by annealing to make the treated areas suitable for device construction, then entire circuits fabricated in such annealed polysilicon may be covered with oxide and successive layers of polysilicon can be built up to achieve further levels of circuitry.

The reason unannealed polysilicon is not suitable for device formation is that it is constituted of randomly oriented crystal grains on the order of 500 angstroms across and hence, carrier flow is impeded at each grain boundary with resulting low mobility which yields poor device characteristics.

In order that the present invention may be fully understood, reference may be made to certain background material, particularly to an article in *Electronics* for Nov. 22, 1979 in which at page 39 it is reported that devices have been formed which are said to have performance capabilities comparable to devices produced in silicon on sapphire (SOS), such devices being formed on easily grown silicon oxide. It is indicated in that article that isolation produced by the silicon oxide might be comparable with the excellent isolation already achieved by the use of sapphire substrates.

Whatever the merits and the possible advantages of the devices and of the technique described in the referenced articles, the building or fabrication of those reported devices begins with a single crystal P type silicon substrate. Accordingly, the starting point is with an expensive substrate.

It is therefore the primary object of the present invention to capitalize on the already known capability for forming active devices in polysilicon that has been formed on an insulator, but to do so utilizing a much less expensive substrate, namely silicon ribbons which are constituted of semicrystalline material grown according to already developed techniques. The techniques of their fabrication can be appreciated by reference to U.S. Pat. Nos. 4,075,055 and 4,116,641, assigned to the assignee of the present application.

Not only is a substantial cost reduction provided by the unique fabrication process of the present invention, involving the utilization of silicon ribbon as a substrate. Continuous processing capability is afforded because of the availability of extended ribbons. Moreover, such ribbons inherently have a unique defect structure which favors strain-induced recrystallization of the polysilicon layer deposited on the silicon oxide grown on the ribbon surfaces. As a result, larger grains are obtained than those realized prior to recrystallization. The same fundamental result is also achieved when single crystal substrates are employed—but of course at much greater cost and requiring techniques such as plasma etching for developing the needed uniform recrystallization.

SUMMARY OF THE INVENTION

In fulfillment of the previously stated as well as other objects, a primary feature of the present invention involves a unique process and the structure produced thereby. This process comprises providing a semicrystalline ribbon of silicon; forming a silicon dioxide layer on the suface of said ribbon; forming a layer of polysilicon on said oxide layer; and annealing said polysilicon layer to induce localized melting and recrystallization of said polysilicon layer into crystals of larger grain size than those that existed prior to such melting and recrystallization. The structure may be characterized as a monolith, including a semicrystalline ribbon of silicon as a substrate, a silicon dioxide layer on a surface of that substrate, and a further layer of annealed polysilicon on the oxide layer.

A specific feature of the improved process includes the formation of active devices such as MOS FETS, which are well known semiconductor devices, in the recrystallized polysilicon layer produced by the previously noted annealing operation. Such devices are achieved by conventional techniques well known in the art, involving photolithographic mask formation, diffusion steps and the like. Consequently, a specific structure can be achieved involving the formation of large numbers of these devices in a monolith as previously noted, including a semicrystalline silicon ribbon serving as the substrate.

Other and further objects, advantages and features of the present invention will be understood by reference to the following specification in conjunction with the annexed drawing, wherein like parts have been given like numbers.

DESCRIPTION OF PREFERRED EMBODIMENT

Figure 1:
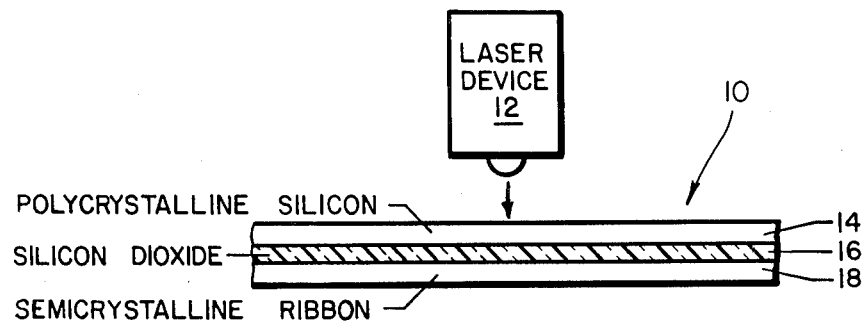
FIG. 1 is an elevational view in cross section representing the process or technique of the present invention for producing devices in a polycrystalline silicon layer formed on silicon dioxide disposed over a ribbon substrate.

Referring now to the figures of the drawing, it will be understood that the process of the present invention is directed to producing a monolithic structure 10 as seen in FIG. 1 which is to be affected by the operation of a laser device 12; that is to say, the laser device is utilized to anneal a polycrystalline silicon layer 14 formed on a silicon dioxide layer 16.

The entire process uniquely exploits various operations or techniques known in the art. Thus to begin with, the substrate 18 upon which the silicon dioxide layer 16 is formed is produced in accordance with methods such as those disclosed in U.S. Pat. No. 4,116,641; that is, a method is preferably followed for forming an elongated silicon crystal body using a die which is a generally truncated wedge-shaped structure having at least one capillary therein; the die is positioned partially submerged in molten material so that the molten material moves into the capillary and, by capillary action, moves to the surface of the die thereby establishing a molten silicon film overlying the top surface of the die.

The details of the technique of U.S. Pat. No. 4,116,641 are incorporated herein by reference. By referring to FIG. 4 in that patent, there will be seen one form of a continuous silicon rubber growth apparatus and the ribbon 83 formed thereby.

It will be appreciated that other techniques known in the art can likewise be exploited in order to produce the desired silicon ribbon. The fundamental or significant consideration is that the ribbon possess a defect structure which favors strain-induced recrystallization of the active device material. What is desired is that appropriately oriented and much larger grains be obtained than would normally exist in the polysilicon layer which is to be deposited on the silicon oxide grown on the ribbon surface.

Likewise, conventional techniques are practiced to form the silicon dioxide layer 16 which is preferably grown to have a thickness of approximately one micrometer. It is essential of course that this layer be uniform in thickness, have a uniform breakdown voltage, and be substantially free of pinholes. The layer 14 of undoped polycrystalline silicon having a thickness of approximately 0.5 micrometer is then deposited on the silicon dioxide layer 16.

The laser device 12 can consist of a pulse frequency-doubled neodymium-yttrium-aluminum-garnet laser which is operative to scan the polysilicon layer 14 so as to induce localized melting thereover. The crucial result obtainable by the use of laser device 12 is that much larger grains are obtained through recrystallization due to the localized melting than already existed when the polysilicon layer 14 was laid down or deposited. Such crystallized material has excellent device properties as already noted.

A variety of devices can be selected for fabrication within the polysilicon layer 14. Typically, devices such as MOS FETS would be formed which can be made in both the enhancement and depletion mode as N-channel devices with a variety of width to length ratios.

Figure 2:
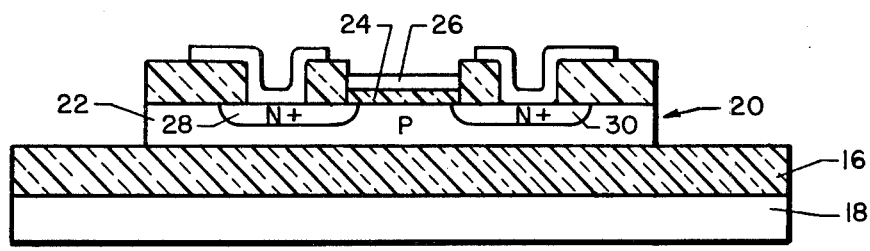
FIG. 2 is an enlarged view of a portion of the monolithic structure of FIG. 1, and particularly illustrating a typical device such as a MOS FET formed in that monolith.

Referring to FIG. 2, an enlarged portion of the structure of FIG. 1 is shown in which a typical MOS FET device is realized. This is preferably accomplished by selectively etching the polysilicon layer 14 seen in FIG. 1 down to the oxide level so as to produce, for example, the isolated island 20 seen in FIG. 2, Ions of a typical impurity such as boron are implanted to form the P− region 22 which is covered with a thermally grown gate oxide layer 24 of approximately 500 angstroms in thickness. A polysilicon gate 26 is deposited on the gate oxide and implanted with phosphorus. This gate also serves for self-alignment in an arsenic ion implantation step in forming the N+ source 28 and the N+ drain 30.

The following examples illustrate preferred specific embodiments of the improved process of the invention.

EXAMPLE 1

A film or layer of $SiO_2$, having a thickness of approximately 1500 Angstroms, was thermally grown on a semicrystalline silicon ribbon 200 microns thick. A layer approximately 4200 Angstroms thick of polysilicon was grown by a technique known as low pressure chemical vapor deposition on the previously thermally formed $SiO_2$. Such construction can be appreciated by reference to FIG. 1. The laser device 12 was operated with the following parameters: a 1/e spot size equal to 180 $\mu m$, scan speed equal to 10 cm/sec., overlapping equal to 50% and with an energy density of approximately 3.4 to 4.5 joules/cm$^2$.

EXAMPLE 2

The same laser parameters as in Example 1 were employed. However, a slightly different configuration was developed by growing polysilicon on a layer of chemical vapor deposition $SiO_2$ which in turn was formed on thermal $SiO_2$, the latter having a thickness of approximately 1500 Angstroms and the former approximately 1000.

EXAMPLE 3

The same laser parameters were retained as in Examples 1 and 2. However, the polysilicon layer was grown on a layer of $Si_3N_4$ having a thickness of 1000 Angstroms, which in turn was grown on a thermal $SiO_2$ layer of approximately 1500 Angstroms.

Figure 3:
FIG. 3 is a photomicrograph of a laser annealed recrystallized polysilicon film deposited on silicon oxide in accordance with the invention.

In all of the Examples cited, the average grain size obtained before annealing was approximately 0.05 $\mu m$, whereas after annealing a grain size of 1 $\mu m$ was realized. A photomicrograph of a laser annealed polysilicon deposited in accordance with the technique of the present invention is seen in FIG. 3. This particular sample involves recrystallized silicon on silicon oxide annealed at 3.49 joules/cm$^2$ and with the grain size as large as 5 $\mu m$.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

We claim:

1. A process of forming a semiconductor monolithic structure comprising:
   providing a semicrystalline ribbon of silicon having a thickness substantially less than 0.5 millimeters and having a suitable defect structure which favors strain-induced recrystallization;
   thermally forming a silicon dioxide layer on a surface of said ribbon;
   forming an active device layer of polysilicon over said oxide layer; and
   annealing said polysilicon layer to induce localized melting and recrystallization of said polysilicon layer whereby uniform crystals of larger grain size than those initially formed are effected in the polysilicon layer due to said defect structure in said semicrystalline ribbon.

2. A process as defined in claim 1, in which said semicrystalline ribbon of silicon has a thickness of approximately 200 microns, said silicon dioxide layer has a thickness of approximately 1500 Angstroms and said layer of polysilicon a thickness of approximately 4200 Angstroms.

3. A process as defined in claim 1, further comprising the step of forming active devices in the recrystallized polysilicon layer.

4. A process as defined in claim 3 in which said active devices are MOS FETS.

5. A process as defined in claim 1, in which said annealing step is achieved by means of a laser.

* * * * *

UNITED STATES PATENT AND TRADEMARK OFFICE
CERTIFICATE OF CORRECTION

PATENT NO. : 4,494,300

DATED : January 22, 1985

INVENTOR(S) : Guenter H. Schwuttke and Kuei H. Yang

It is certified that error appears in the above-identified patent and that said Letters Patent are hereby corrected as shown below:

Column 1, line 50, "articles" should read --article--.

Column 3, line 17, "rubber" should read --ribbon--;

line 58, a period (.) and not a comma (,) should follow "FIG. 2" and precede "Ions".

Signed and Sealed this

Second Day of July 1985

[SEAL]

Attest:

DONALD J. QUIGG

Attesting Officer     Acting Commissioner of Patents and Trademarks